United States Patent
Ebrahimzad et al.

(10) Patent No.: US 12,015,480 B2
(45) Date of Patent: *Jun. 18, 2024

(54) SYSTEMS AND METHODS FOR USING NOT PERFECTLY POLARIZED BIT CHANNELS IN PARALLEL POLAR CODES

(71) Applicant: Huawei Technologies Co., Ltd., Shenzhen (CN)

(72) Inventors: Hamid Ebrahimzad, Kanata (CA); Zhuhong Zhang, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/070,035

(22) Filed: Nov. 28, 2022

(65) Prior Publication Data
US 2023/0106123 A1   Apr. 6, 2023

Related U.S. Application Data

(63) Continuation of application No. 17/163,100, filed on Jan. 29, 2021, now Pat. No. 11,515,964.

(51) Int. Cl.
*H04L 1/00* (2006.01)

(52) U.S. Cl.
CPC .......... *H04L 1/0042* (2013.01); *H04L 1/0054* (2013.01)

(58) Field of Classification Search
CPC ... H04L 1/0042; H04L 1/0054; H04L 1/0057; H04L 1/00; H03M 13/13; H03M 13/611; H03M 13/2927
See application file for complete search history.

(56) References Cited

U.S. PATENT DOCUMENTS

| 10,135,460 B2 | 11/2018 | Ionita et al. |
| 11,349,598 B2 | 5/2022 | Hui et al. |
| (Continued) | | |

FOREIGN PATENT DOCUMENTS

| CN | 108702290 A | 10/2018 |
| CN | 109716692 A | 5/2019 |
| (Continued) | | |

OTHER PUBLICATIONS

E. Arikan, "Channel polarization: A method for constructing capacity achieving codes for symmetric binary-input memoryless channels," IEEE Trans. Inf. Theory, vol. 55, pp. 3051-3073, Jul. 2009.I.

(Continued)

*Primary Examiner* — Sophia Vlahos

(57) ABSTRACT

The disclosed systems, structures, and methods are directed to encoding and decoding information for transmission across a communication channel. The encoding method includes: distributing the information bits between m parallel polar codes such that each of the m parallel polar codes includes a subset of the information bits; splitting the subset of information bits in each of the m parallel polar codes into a protected information section and a full rate information section; protecting information bits in the protected information section of each of the m parallel polar codes; arranging a plurality of frozen bits in each of the m parallel polar codes; and generating a polar encoded codeword for each of the m parallel polar codes.

18 Claims, 8 Drawing Sheets

(56) References Cited

U.S. PATENT DOCUMENTS

| | | |
|---|---|---|
| 11,515,964 B2* | 11/2022 | Ebrahimzad ......... H03M 13/611 |
| 2017/0047947 A1 | 2/2017 | Hong et al. |
| 2017/0230059 A1 | 8/2017 | Giard et al. |
| 2017/0353271 A1 | 12/2017 | Kudekar et al. |
| 2017/0364399 A1* | 12/2017 | Shi ......... H04L 1/0057 |
| 2018/0097580 A1 | 4/2018 | Zhang et al. |
| 2018/0287640 A1 | 10/2018 | Lin et al. |
| 2018/0351693 A1* | 12/2018 | Jang ......... H03M 13/13 |
| 2018/0351698 A1 | 12/2018 | Lin et al. |
| 2018/0376468 A1* | 12/2018 | Lin ......... H04L 1/0064 |
| 2019/0245650 A1 | 8/2019 | Hui et al. |
| 2020/0177211 A1 | 6/2020 | Fazeli Chaghooshi et al. |
| 2020/0204301 A1 | 6/2020 | Wu et al. |
| 2020/0266840 A1 | 8/2020 | Sunwoo et al. |
| 2020/0343909 A1 | 10/2020 | Chen et al. |
| 2022/0345351 A1* | 10/2022 | Gresset ......... H04L 1/0002 |

FOREIGN PATENT DOCUMENTS

| | | |
|---|---|---|
| CN | 109804566 A | 5/2019 |
| CN | 110168976 A | 8/2019 |

OTHER PUBLICATIONS

Tal and A. Vardy, "List decoding of polar codes", IEEE Trans. IT, vol. 61, No. 5, pp. 2213-2226, Mar. 2015.

M. El-Khamy, H. Mahadavifar, G. Feygin, J. Lee and I. Kang, "Relaxed polar codes", IEEE Trans. IT, vol. 63, No. 4, pp. 1986-2000, Apr. 2017.

T Kolie-Akino, et. Irregular Polar Coding for Complexity-Constrained Lightwave Systems, Journal of lightwave tech, vol. 36, No. 11, 2018.

G. Sarkis, P. Giard, A. Vardy, C. Thibeault, and W. Gross, "Fast polar decoders: Algorithm and implementation," IEEE J. Sel. Areas Commun., vol. 32, No. 5, pp. 946-957, May 2014.

M. Hanif and M. Ardakani, "Fast successive-cancellation decoding of polar codes: Identification and decoding of new nodes," IEEE Commun. Lett., vol. 21, No. 11, pp. 2360-2363, Nov. 2017.

S. A. Hashemi, C. Condo, and W. J. Gross, "Simplified successive cancellation list decoding of polar codes," in IEEE Int. Symp. on Inform. Theory, Jul. 2016, pp. 815-819.

Z. Zhang "Progressive Bit-Flipping Decoding of Polar Codes over Layered Critical Sets" Computer Science GLOBECOM 2017—2017 IEEE Global Communications Conference Dec. 2017.

\* cited by examiner

SYSTEMS AND METHODS FOR USING NOT PERFECTLY POLARIZED BIT CHANNELS IN PARALLEL POLAR CODES

CROSS-REFERENCE TO RELATED APPLICATIONS

The present disclosure is a continuation of U.S. patent application Ser. No. 17/163,100, entitled "SYSTEMS AND METHODS FOR USING NOT PERFECTLY POLARIZED BIT CHANNELS IN PARALLEL POLAR CODES", filed Jan. 29, 2021, the entirety of which is hereby incorporated by reference.

FIELD OF THE INVENTION

The present disclosure relates generally to the field of encoding and decoding information for transmission over a noisy medium, and more particularly to systems and methods for using polar codes to enhance data transmission reliability.

BACKGROUND

In a data communication system, data are transmitted over a channel from a transmitter to a receiver. Transmitted data are subject to degradation due to noise in the channel, to the data that are received may not be identical to the data that were transmitted. The implementation of the transmitter and receiver depends upon the channel over which the data are to be transmitted, e.g., whether the channel is wireless, a cable, or an optical fiber.

Forward error correction codes (FECs) provide reliable communications in a one-directional channel by enabling a receiver to detect and correct a limited number of errors. Forward Error Correction (FEC) techniques may be used to reduce bit error rate (BER). A message may be transmitted using FEC-encoded bits, which include redundant information, such as parity or check bits. The bit estimates recovered at the receiver are estimates of the FEC-encoded bits generated at the transmitter. These estimates may undergo FEC decoding at the receiver based on a chosen FEC scheme. The FEC decoding makes use of the redundant information that was included in the FEC-encoded bits in order to detect and correct bit errors. Ultimately, estimates of the original message bits may be recovered from the FEC-decoded bit estimates.

Two basic types of FECs are block FECs and convolution FECs. Block FECs split the data into blocks, each of which is independently encoded (i.e., independently of other blocks) prior to transmission. In convolutional FECs, the encoded data depend on both the current and previous data. in digital communication scheme.

FECs are important in data transmission systems. For example, in high-throughput optical transmission systems, it is not uncommon for forward error correction to consume more than half of the power in optical digital processing (oDSP). It is, therefore, desirable to design FECs with high coding gain, low latency and low power consumption.

There are many techniques for designing FECs, and many types of FECs are known in the art (e.g., algebraic code, convolutional turbo code, low-density parity-check (LDPC) code, turbo product codes (TPC), etc.). In 2009, Arikan introduced a kind of block FEC known as "polar codes," in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009). A polar code is a linear block code that "polarizes" the capacity of bit channels. That is, after being polarized by the polar block code, the bit channels polarize such that their capacities either approach one (i.e., a perfect channel) or zero (a completely noisy channel). Data are then sent through the bit channels that have capacities near one, while predetermined (e.g., constant) bit values are sent over bit channels that have a capacity near zero (these are referred to as "frozen" bits, since their values do not vary). Arikan was able to show that, as the code length (i.e., the number of bit channels) approaches infinity, the number of bit channels with capacity of one, divided by the total number of bit channels, approaches the channel capacity—i.e., the theoretical maximum data rate for the channel (also known as the "Shannon capacity").

The polar code decoding algorithm proposed by Arikan is known as "successive-cancellation" (SC) decoding, which can be effectively represented as a binary tree search. Although SC decoding displays excellent performance as the length of the code approaches infinity, its performance with short- and medium-length codes is disappointing. Accordingly, many alternative decoding algorithms have been proposed. One of the most frequently cited of these alternatives, known as "successive-cancellation-list" (SCL) decoding, was introduced in I. Tal and A. Vardy, "List Decoding of Polar Codes," *IEEE Trans. Inf. Theory*, vol. 61, no. 5, pp. 2213-2226 (May 2015). SCL decoding combines list decoding (a decoding technique that has been known since the 1950s) with SC decoding of polar codes, to produce an algorithm that, instead of looking at a single candidate codeword (as is done in SC decoding), examines a "list" of the $L_m$ most probable candidate codewords. SCL decoding of polar codes, combined with a cyclic redundancy check (CRC—a class of error detection codes known since 1961), has been shown to have error correction performance comparable to low-density parity-check codes. However, both SC and SCL decoders suffer from high latency and it is difficult to implement them in high throughput applications.

Polar codes are the first and, at present, the only class of codes that have been analytically proven to be able to achieve channel capacity within an implementable complexity. While polar codes have this theoretical advantage over other known FECs, in terms of practical implementation, many challenges remain. It would, therefore, be desirable to develop methods of using polar coding techniques having increased coding gain and high throughput.

SUMMARY

The present disclosure provides an encoder and a decoder that use multiple polar codes in parallel and with cooperation between them. This cooperation provides improvements in gain compared to a conventional polar code, and using parallel polar codes increases the total throughput. The disclosed technology may, therefore, be seen as improving the reliability and throughput of digital communications.

In accordance with one aspect of the present disclosure, the technology is implemented as a method for encoding information bits for transmission across a communication channel, the method may include: distributing the information bits between m parallel polar codes such that each of the m parallel polar codes includes a subset of the information bits; splitting the subset of information bits in each of the m parallel polar codes into a protected information section and a full rate information section; protecting information bits in the protected information section of each of the m parallel polar codes; arranging a plurality of frozen bits in each of the m parallel polar codes; and generating a polar encoded codeword for each of the m parallel polar codes.

In some embodiments, the information bits in the protected information section of each of the m parallel polar codes are arranged in positions in non-perfectly polarized bit channels in the respective parallel polar code of the m parallel polar codes.

In some embodiments, for each of the m parallel polar codes: the positions in the non-perfectly polarized bit channels are grouped into a plurality of L blocks, wherein each of the plurality of L blocks includes a subset of the information bits in the protected information section.

In some embodiments, a total number of the plurality of blocks in the non-perfectly polarized bit channels in each of the m parallel polar codes is determined based on a total number of greater-than-one factors of m.

In some embodiments, the information bits in the protected information section of each of the m parallel polar codes are protected using a repetition code.

In some embodiments, the information bits in a block of the plurality of L blocks of a first parallel polar code from the m parallel polar codes are repeated in a block of the plurality of L blocks of a second parallel polar code from the m parallel polar codes.

In some embodiments, the information bits in a block of the plurality of L blocks of a first parallel polar code from the m parallel polar codes are repeated $d_i$ times in the m parallel polar codes, $d_i$ being a factor of m and greater than one.

In some embodiments, the information bits in the protected information section of each of the m parallel polar codes are protected using a Bose-Chaudhuri-Hocquenghem (BCH) code or a Reed-Muller code.

In accordance with another aspect of the present disclosure, there is a method for decoding m polar coded codewords received over a communication channel, each of the m polar coded codewords encoding information bits in a plurality of nodes, the method may include, for each node in each codeword from the m polar coded codewords: when the node is in a full rate information section: decoding the node based on a log-likelihood ratio (LLR) decoding algorithm to generate a first part of a decoded message; and when the node is in a protected information section: decoding the node based on an averaged LLR decoding algorithm to generate a second part of the decoded message.

In some embodiments, a SC or SCL decoder is used to perform the decoding of the node in the codeword.

In some embodiments, the method may further include, for each of the m polar coded codewords: when a bit in the respective codeword is a frozen bit, generating a decoded bit in the decoded message based on a predetermined value.

In some embodiments, the averaged LLR decoding algorithm is based on:

$$LLR_k^n = \frac{1}{K} \sum_{j=(k-1)d_i+1}^{kd_i} LLR_j^o$$

where $$1 \leq k \leq \frac{m}{d_i},$$

$d_i$ is a total number of repetitions for the node in the m polar coded codewords, and $LLR_j^o$ is the LLR of the node in the respective codeword j in the m polar coded codewords, j=1 . . . m.

In accordance with an aspect of the present disclosure, there is an encoder that encodes information bits for transmission across a communication channel, the encoder having a circuitry configured to: distribute the information bits between m parallel polar codes such that each of the m parallel polar codes includes a subset of the information bits; split the subset of information bits in each of the m parallel polar codes into a protected information section and a full rate information section; protect information bits in the protected information section of each of the m parallel polar codes; arrange a plurality of frozen bits in each of the m parallel polar codes; and generate a polar encoded codeword for each of the m parallel polar codes.

In some embodiments, the circuitry includes at least one processor and a memory storing programmed instructions that when executed by the at least one processor cause the at least one processor to encode the information bits.

In some embodiments, the information bits in the protected information section of each of the m parallel polar codes are arranged in positions in non-perfectly polarized bit channels in the respective parallel polar code of the m parallel polar codes.

In some embodiments, for each of the m parallel polar codes: the positions in the non-perfectly polarized bit channels are grouped into a plurality of L blocks, wherein each of the plurality of L blocks includes a subset of the information bits in the protected information section.

In some embodiments, the information bits in the protected information section of each of the m parallel polar codes are protected using a repetition code.

In some embodiments, the information bits in a block of the plurality of L blocks of a first parallel polar code from the m parallel polar codes are repeated in a block of the plurality of L blocks of a second parallel polar code from the m parallel polar codes.

In some embodiments, the information bits in a block of the plurality of L blocks of a first parallel polar code from the m parallel polar codes are repeated $d_i$ times in the m parallel polar codes, $d_i$ being a factor of m and greater than one.

In accordance with an aspect of the present disclosure, there is a decoder that decodes m polar coded codewords received over a communication channel, the decoder having a circuitry configured to, for each node in each codeword from the m polar coded codewords: when the node is in a full rate information section: decode the node based on a log-likelihood ratio (LLR) decoding algorithm to generate a first part of a decoded message; when the node is in a protected information section: decode the node based on an averaged LLR decoding algorithm to generate a second part of the decoded message; and when a bit in the respective codeword is a frozen bit, generating a decoded bit in the decoded message based on a predetermined value.

BRIEF DESCRIPTION OF THE FIGURES

The features and advantages of the present disclosure will become apparent from the following detailed description, taken in combination with the appended drawings, in which.

Figure 1:
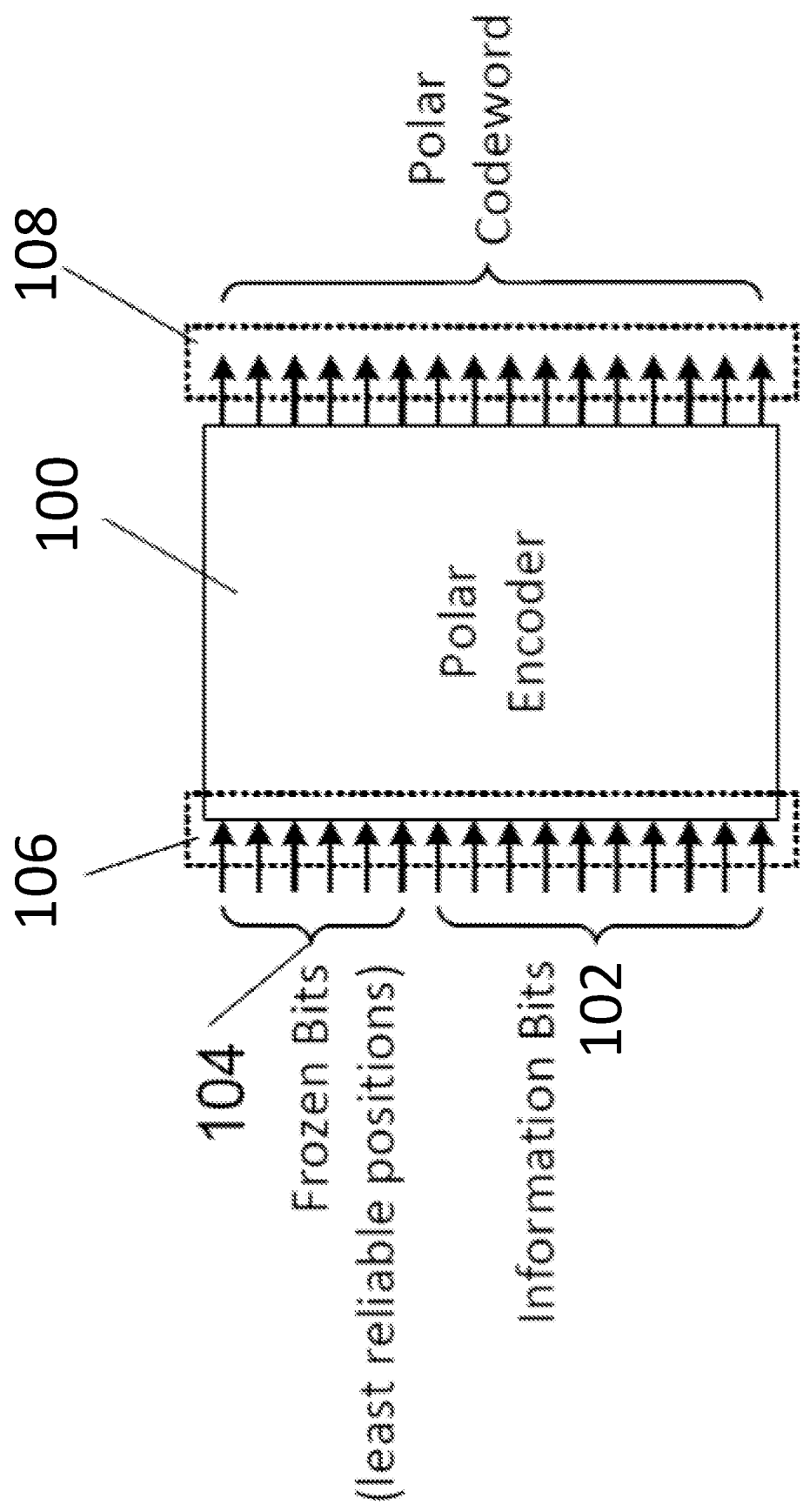
FIG. 1 shows an encoder for a polar code such as may be used for polar encoding in accordance with some example embodiments.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Various representative embodiments of the disclosed technology will be described more fully hereinafter with reference to the accompanying drawings. The present technology may, however, be embodied in many different forms and should not be construed as limited to the representative embodiments set forth herein. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element, or intervening elements may be present (e.g., indirect connection or coupling). By contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). Additionally, it will be understood that elements may be "coupled" or "connected" mechanically, electrically, communicatively, wirelessly, optically, and so on, depending on the type and nature of the elements that are being coupled or connected.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The functions of the various elements shown in the figures, including any functional block labeled as a "processor," may be provided through the use of dedicated hardware as well as hardware capable of executing instructions, in association with appropriate software instructions. When provided by a processor, the functions may be provided by a single dedicated processor, by a single shared processor, or by a plurality of individual processors, some of which may be shared. In some implementations of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, an application-specific integrated circuit (ASIC), a field-programmable gate array (FPGA), a read-only memory (ROM) for storing software, a random access memory (RAM), and non-volatile storage. Other hardware, conventional and/or custom, may also be included.

Software modules, or simply modules or units which are implied to be software, may be represented herein as any combination of flowchart elements or other elements indicating the performance of process steps and/or textual description. Such modules may be executed by hardware that is expressly or implicitly shown. Moreover, it should be understood that a module may include, for example, but without limitation, computer program logic, computer program instructions, software, stack, firmware, hardware circuitry, or a combination thereof, which provides the required capabilities. It will further be understood that a "module" generally defines a logical grouping or organization of related software code or other elements as discussed above, associated with a defined function. Thus, one of ordinary skill in the relevant arts will understand that particular code or elements that are described as being part of a "module" may be placed in other modules in some implementations, depending on the logical organization of the software code or other elements, and that such modifications are within the scope of the disclosure as defined by the claims.

It should also be noted that as used herein, the term "optimize" means to improve. It is not used to convey that the technology produces the objectively "best" solution, but rather that an improved solution is produced. In the context of memory access, it typically means that the efficiency or speed of memory access may be improved.

As used herein, the term "determine" generally means to make a direct or indirect calculation, computation, decision, finding, measurement, or detection. In some cases, such a determination may be approximate. Thus, determining a value indicates that the value or an approximation of the value is directly or indirectly calculated, computed, decided upon, found, measured, detected, etc. If an item is "predetermined" it is determined at any time prior to the instant at which it is indicated to be "predetermined."

The present technology may be implemented as a system, a method, and/or a computer program product. The computer program product may include a computer-readable storage medium (or media) storing computer-readable program instructions that, when executed by a processor, cause the processor to carry out aspects of the disclosed technology. The computer-readable storage medium may be, for example, an electronic storage device, a magnetic storage device, an optical storage device, an electromagnetic storage device, a semiconductor storage device, or any suitable combination of these. A non-exhaustive list of more specific examples of the computer-readable storage medium includes: a portable computer disk, a hard disk, a random access memory (RAM), a read-only memory (ROM), a flash memory, an optical disk, a memory stick, a floppy disk, a mechanically or visually encoded medium (e.g., a punch card or bar code), and/or any combination of these. A computer-readable storage medium, as used herein, is to be construed as being a non-transitory computer-readable medium. It is not to be construed as being a transitory signal, such as radio waves or other freely propagating electromagnetic waves, electromagnetic waves propagating through a waveguide or other transmission media (e.g., light pulses passing through a fiber-optic cable), or electrical signals transmitted through a wire.

It will be understood that computer-readable program instructions can be downloaded to respective computing or processing devices from a computer-readable storage medium or to an external computer or external storage device via a network, for example, the Internet, a local area network, a wide area network and/or a wireless network. A network interface in each computing/processing device may receive computer-readable program instructions via the network and forwards the computer-readable program instructions for storage in a computer-readable storage medium within the respective computing or processing device. Computer-readable program instructions for carrying out operations of the present disclosure may be assembler instructions, machine instructions, firmware instructions, configuration data for integrated circuitry, or either source code or object code written in any combination of one or more programming languages.

All statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable program instructions. These computer-readable program instructions may be provided to a processor or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowcharts, flow diagrams, state transition diagrams, pseudo-code, and the like.

The computer-readable program instructions may also be loaded onto a computer, other programmable data processing apparatus or other devices to cause a series of operational steps to be performed on the computer, other programmable apparatus or other devices to produce a computer-implemented process, such that the instructions which execute on the computer, other programmable apparatus, or other device implement the functions/acts specified in the flowcharts, flow diagrams, state transition diagrams, pseudo-code, and the like.

In some alternative implementations, the functions noted in flowcharts, flow diagrams, state transition diagrams, pseudo-code, and the like may occur out of the order noted in the figures. For example, two blocks shown in succession in a flowchart may, in fact, be executed substantially concurrently, or the blocks may sometimes be executed in the reverse order, depending upon the functionality involved. It will also be noted that each of the functions noted in the figures, and combinations of such functions can be implemented by special-purpose hardware-based systems that perform the specified functions or acts or by combinations of special-purpose hardware and computer instructions.

With these fundamentals in place, some non-limiting examples to illustrate various implementations of aspects of the present disclosure are discussed next.

FIG. 1 shows an encoder 100 for a polar code. As discussed above, a polar code is a linear block code that "polarizes" the capacity of bit channels (which may also be referred to as sub-channels), such that their capacities either approach one (i.e., a perfect channel) or zero (a completely noisy channel). Information bits 102 in a message are then sent via the bit channels that have capacities near one, while frozen bits 104—predetermined constant bit values—are sent over bit channels that have a capacity near zero.

Let N and k be positive integers with k≤N. For an (N, k) block code, its input is a vector of k bits and its output is a vector of N bits. An encoder is an implementation of (N, k) block code, which may be a function, in software or hardware. N is called the block size or block length. k/N may be referred to as the code rate.

A polar encoder 100 generally encodes input bits 106, including information bits 102 and frozen bits 104, and have a total block length of N=2$^m$, where n is an integer. This may be referred to an (N, k) polar code, with k information bits (i.e., information bits 102) and N encoded bits 108, leaving (N−k) frozen bits 104. In general, an (N, k) polar code can be defined by an N×N generator matrix G, where:

$$G = \begin{bmatrix} 1 & 1 \\ 0 & 1 \end{bmatrix}^{\otimes n}$$

In the above formulation, $[\cdot]^{\otimes n}$ denotes the n-fold Kronecker power. Where the input bits 106 are denoted $u=[u_1, u_2, \ldots, u_N]^T$ and the encoded bits 108 (collectively referred to as the "codeword" x) are denoted $x=[x_1, x_2, \ldots, x_N]^T$, the codeword is given by x=GBu, where B denotes an N×N bit-reversal permutation matrix. This operation takes place within the polar encoder 100.

It will be understood that the generator matrix G is only one generator matrix that results in polarization, and that other generator matrices are also known to produce such polarization. Additionally, although the frozen bits 104 are shown, for ease of illustration, as being located at the front within the input bits 106, they may, in fact, be scattered throughout the input bits 106.

It will further be understood that complete polarization of the channels is only achieved at the limit as N→∞. For small and mid-sized code lengths N, a polar code will produce channels having a range of capacities, which, while still generally polarized toward either 1 (i.e., a perfect channel)

or 0 (i.e., a completely noisy channel), will not reach either of these limits. Thus, for real-world polar coding, the k information bits 102 should be placed in the k most reliable (i.e., highest capacity) locations in u. The N-k frozen bits 104 can be then placed in the locations in u having the lowest reliability and are assigned fixed values known to both the encoder 100 and the decoder (not shown in FIG. 1).

Figure 2:
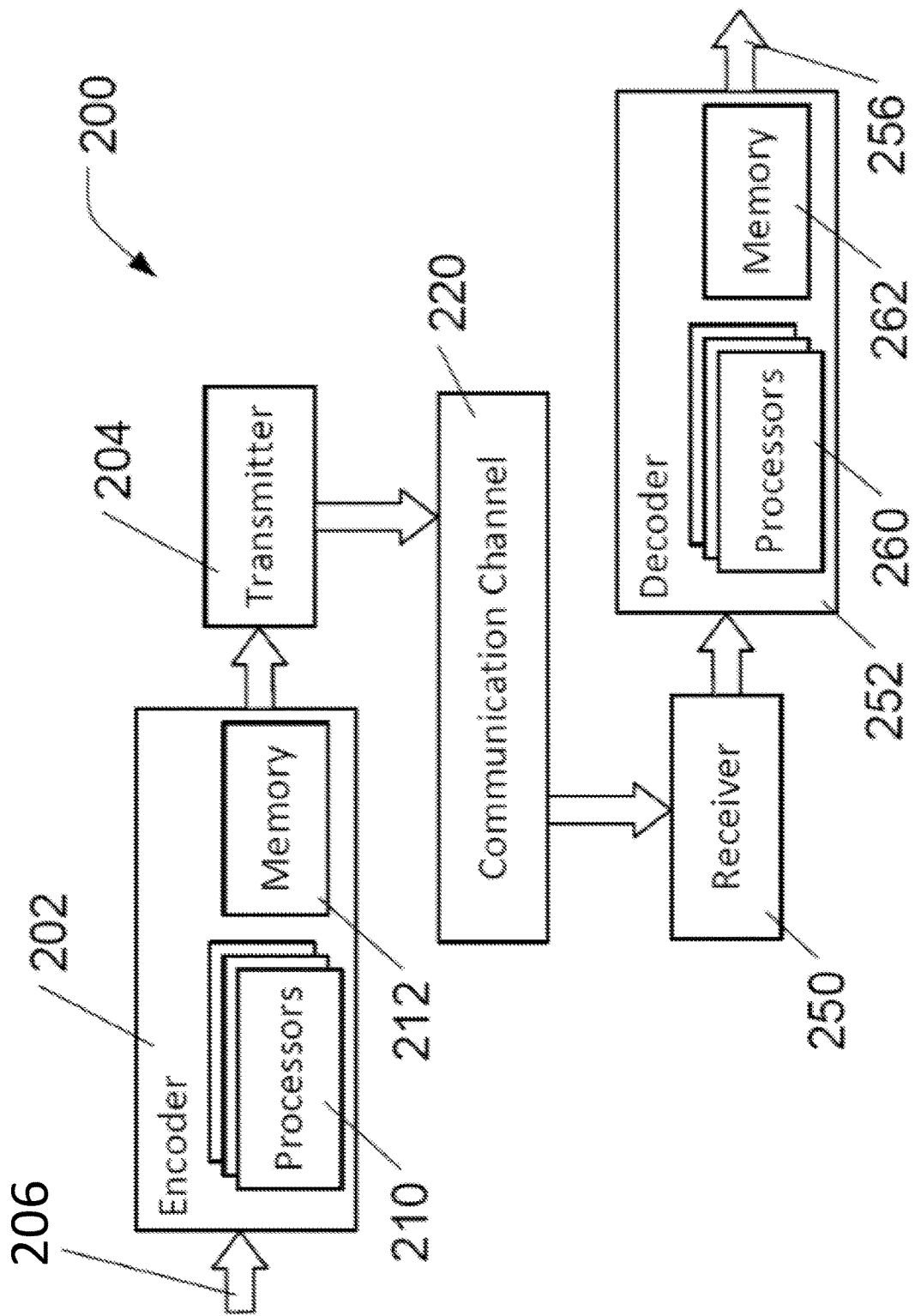
FIG. 2 shows a block diagram of a communication system in which the technology of the present disclosure may be implemented.

FIG. 2 is a block diagram of a communication system 200 in which the technology of the present disclosure may be implemented. The communication system includes an encoder 202 and transmitter 204, a communication channel 220, and a receiver 250 and decoder 252.

As already discussed, the communication channel 220 may be, for example, a wireless communication channel, a cable, or an optical fiber. It will be understood that there may be noise or interference on the communication channel 220. As a result of this noise or interference, some of the bits received at the receiver 250 may have been altered during transmission, and therefore may not be the same as the bits that were transmitted over the communication channel 220 by the transmitter 204.

The encoder 202 receives blocks of information (e.g., a message or part of a message) to be transmitted at its input 206, encodes the information according to an implementation of the disclosed technology as described below to produce codewords for transmission over the communication channel 220, and forwards the codewords to the transmitter 204 for transmission over the communication channel 220. In some implementations, the encoder 202 includes one or more processors 210 and a memory 212 that includes programmed instructions that cause the processors 210 to encode the information as described below. It will be understood that in some implementations, the encoder 202 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to encode the information as described below.

The transmitter 204 transmits the codewords over the communication channel 220. Accordingly, the configuration of the transmitter 204 will depend on the nature of the communication channel 220. In general, the transmitter 204 is a conventional transmitter for the communication channel 220. Accordingly, while not shown, the transmitter 204 may include modules for post-encoding processing, as well as modules or components of a transmit chain for the communication channel 220, such as modulators, amplifiers, multiplexers, light sources (e.g., for optical communication), antennas (e.g., for wireless communication), and/or other modules or components of a conventional transmitter.

Similarly, the receiver 250 receives codewords via the communication channel 220. Thus, details of the configuration of the receiver 250 will depend on the nature of the communication channel 220. The receiver 250 is a conventional receiver for the communication channel 220 and may include a variety of modules and components of a conventional receive chain (not shown), as well as components (not shown) used for any pre-decoding processing. For example, these modules and components may include antennas (e.g., for wireless communication), optical sensors or detectors (e.g., for optical communication), demodulators, amplifiers, demultiplexers, and/or other modules or components of a conventional receive chain.

Codewords received by the receiver 250 are forwarded to the decoder 252.

The decoder 252 receives codewords from the receiver 250 and decodes the codewords according to an implementation of the disclosed technology as described below to produce received information which is provided by the decoder as output 256. In some implementations, the decoder 252 includes one or more processors 260 and a memory 262 that includes programmed instructions that cause the processors 260 to decode the information as described below. It will be understood that in some implementations, the decoder 252 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to decode the information as described below.

Figure 3:
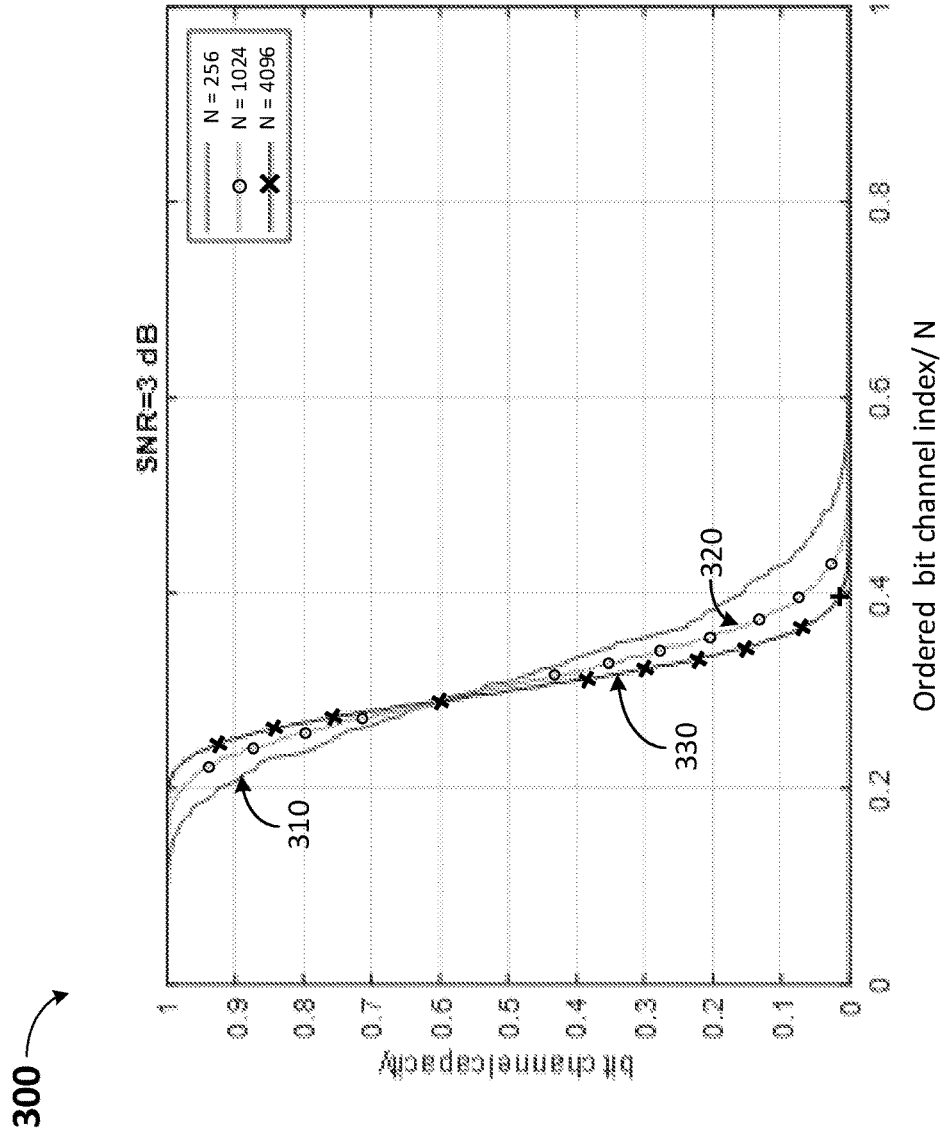
FIG. 3 shows an example chart in which the bit channel capacities of three polar codes are illustrated.

FIG. 3 shows an example chart 300 in which the bit channel capacities of three polar codes are illustrated. The signal-to-noise ratio (SNR) of the communication channel is 3 dB. The x-axis represents ordered bit channel index divided by the block length, N. In this context, "divided" refers to a mathematical operation. The y-axis represents bit channel capacity value, where a capacity value of "1" is known as the Shannon capacity. As can be seen, along all three polar codes transmitted through the same environment (e.g., SNR=3 dB), the polar code 310 with the block length N=256 has the smallest ratio of the number of bit channels approaching the capacity of 1 or 0 (i.e., the perfectly polarized bit channels) to the block length 256. The polar code 320 with block length N=1024 has the second smallest ratio of the number of bit channels approaching the capacity of 1 or 0 (i.e., the perfectly polarized bit channels) to the block length 1024. The polar code 330 with the block length N=4096 has the largest ratio of the number of bit channels approaching the capacity of 1 or 0 (i.e., the perfectly polarized bit channels) to the block length 4096. This demonstrates that better polarization of the channels is achieved when N increases.

Figure 4:
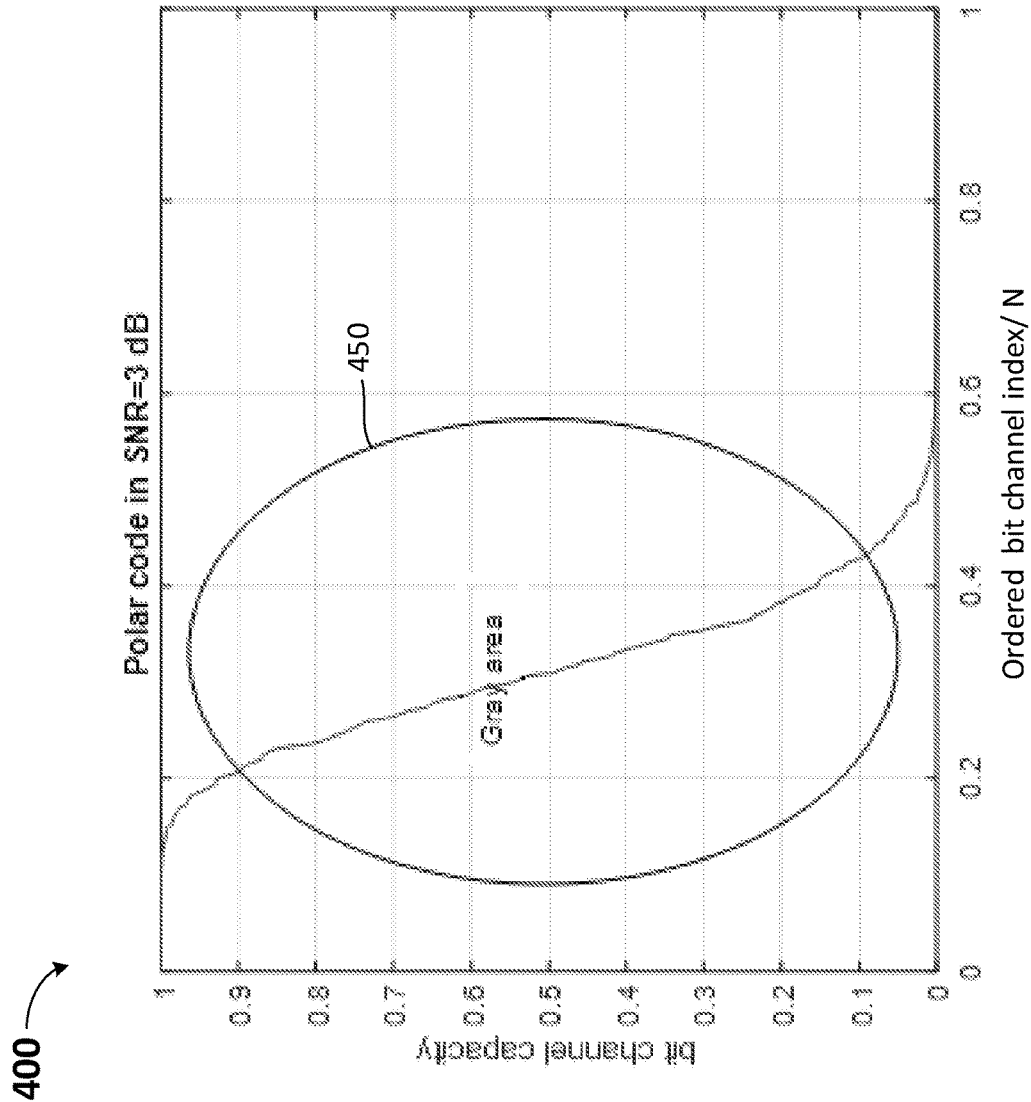
FIG. 4 shows an example chart in which a bit channel capacity of one polar code is illustrated.

FIG. 4 shows an example chart 400 in which a bit channel capacity of one polar code is illustrated. The x-axis represents ordered bit channel index divided by the block length, N. In this context, "divided" refers to a mathematical operation. The y-axis represents bit channel capacity value. The SNR is assumed to be 3 dB, and the gray area 450 represents an area of bit channels that have a bit channel capacity between approximately 0.05 to 0.95, may be referred to as non-perfectly polarized bit channels. It is to be appreciated that the definition of bit channel capacity of non-perfectly polarized bit channels may vary based on a number of factors such as communication channel noise, encoding algorithm efficiency, communication standard (e.g., 4G versus 5G), or a type of communication channel (e.g., wireless communication versus optical communication); for example, in some cases, the bit channel capacity of non-perfectly polarized bit channels may be defined to be within a range of 0.1 to 0.9 (based on the Shannon Capacity).

As shown in FIG. 4, the ratio of the number of non-perfectly polarized bit channels to the block length N generally decreases with increasing code block length N, but for small and mid-sized code lengths N, a polar code will produce some channels having a range of capacities, which, while still generally polarized toward either 1 (i.e., a perfect channel) or 0 (i.e., a completely noisy channel), will not reach either of these limits. The ratio of perfectly polarized bit channels to the non-perfectly polarized bit channels (or to the block length N) generally decreases as the block length N decreases.

In a conventional polar code, the non-perfectly polarized bit channels are typically treated as polarized bit channels: if the capacity of the bit channel approaches 1, full rate information is sent through the channel; or if the capacity of the bit channel approaches 0, a bit in the bit channel is treated as a frozen bit. However, the bit channels within area 450 are in fact not perfectly polarized and sending full rate information through these bit channels may result in a higher bit error rate (BER) than sending full rate information through more perfectly polarized bit channels approaching a capacity of 1, such as those above area 450 in FIG. 4. On the other hand, treating the bits in these non-perfectly polarized bit channels as frozen bits may waste the capacity of the bit channels. The technology in this disclosure utilizes the non-perfectly polarized bit channels to send information bits using some form of protection (safeguarding), such as using repetition code for these bit channels when sending information bits, as described in detail below. The disclosed technology provides a gain that can support higher throughput compared to the conventional polar code, and can be used in 5G wireless communication standard as well.

Figure 5:
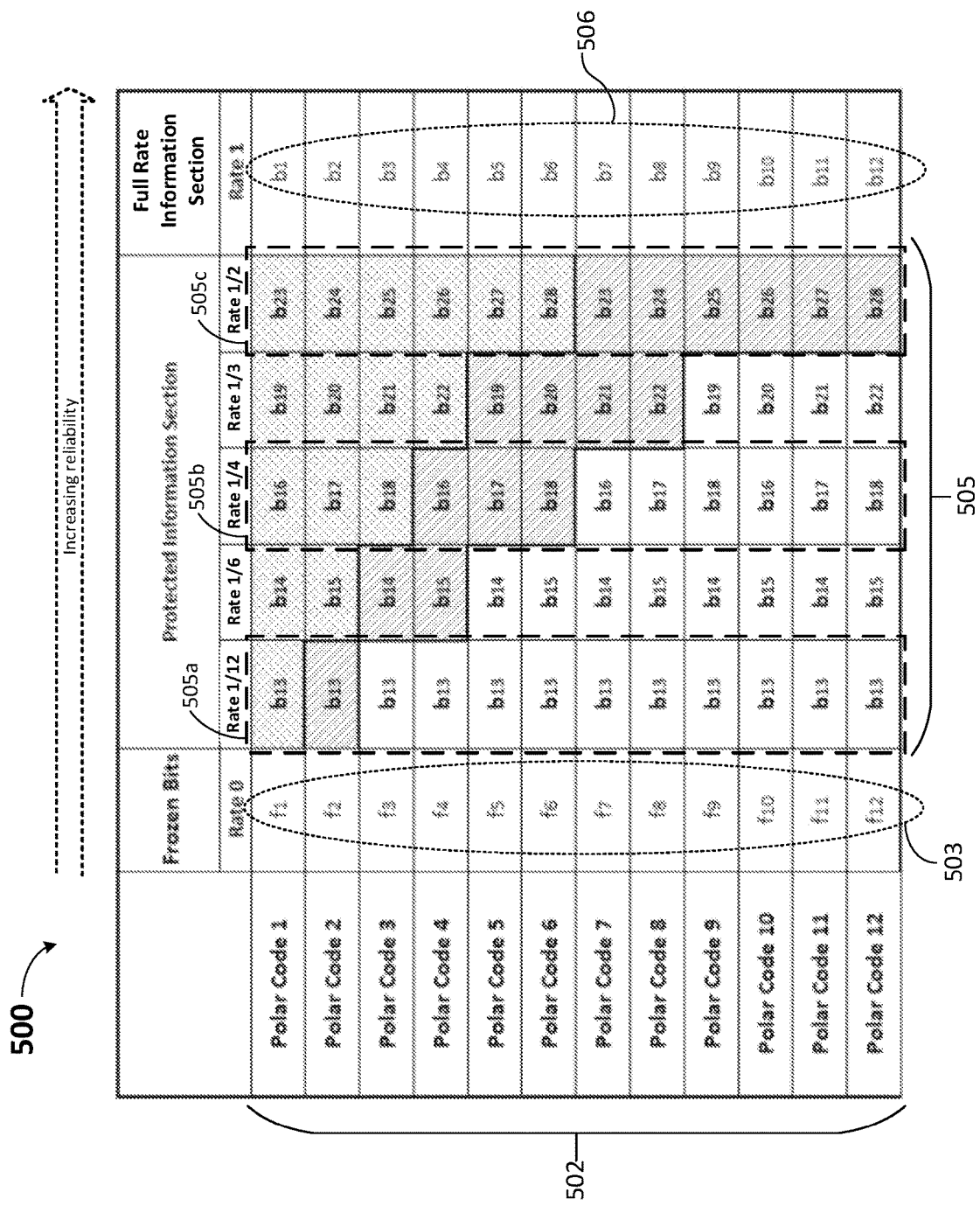
FIG. 5 shows the structure of example parallel polar codes in accordance with some example embodiments.

FIG. 5 illustrates a structure 500 of parallel polar codes in accordance with the present disclosure. Information bits grouped in various blocks $b_1, b_2 \ldots, b_{28}$ are sent using m parallel polar codes, such that each of the m parallel polar codes includes an non-empty subset of the information bits. (Empty sets and empty subsets are ignored). Some blocks may be repeated among the m parallel polar codes. As shown, in the illustrated example, there are m parallel polar codes 502 where m=12, shown along the vertical axis as Polar Code 1-Polar Code 12. A polar encoded codeword may be generated for each of the m parallel polar codes 502.

The polar coded information is shown along the horizontal axis, with the least reliable bit channels at the left, and increasing reliability of positions from left to right. Frozen bits 503, labelled as $f_1, f_2 \ldots, f_{12}$, occupy the least reliable bits at the left (i.e., the bit channels with capacities closest to zero). The information bits in each polar code are distributed into two sections, referred to as a Protected Information Section and a Full Rate Information Section. Information bits 506 (grouped as blocks $b_1, b_2 \ldots, b_{12}$) in the Full Rate Information Section occupy the most reliable bit channels (i.e., the bit channels with capacities closest to one) and are sent using full rate. The information bits 506 in the Full Rate Information Section may, in some embodiments, be protected using conventional error-correcting codes such as BCH code or Reed-Muller code.

Information bits 505 (grouped as blocks $b_{13}, b_{14} \ldots, b_{28}$) in the Protected Information Section occupy the non-perfectly polarized bit channel positions and are sent using a rate less than one, which means, as described further below in detail, the information bits 505 are protected in one or more other rows among the m parallel polar codes. It is to be appreciated that $b_1, b_2 \ldots$ to $b_{28}$ each is a block of bits and may each include one or more single bits (e.g., binary bits).

In some example embodiments, in each polar code 502 out of the m parallel polar codes 502, the information bits 505 in the non-perfectly polarized bit channel positions may be grouped into a plurality of L blocks of bit (simply referred to as "block(s)" hereinafter). Each of the L plurality of blocks has a subset of the information bits 505 in the protected information section. In the example shown in FIG. 5, L=5. The number of bits in each block in the L blocks may vary.

For example, for Polar Code 1, information bits may be grouped into one of many blocks $b_{13}, b_{14}, b_{16}, b_{19}$ and $b_{23}$.

Each of these blocks $b_{13}, b_{14}, b_{16}, b_{19}$ and $b_{23}$ may be sent using a different code rate. For example, still referring to Polar Code 1, block $b_{13}$ may be sent using a rate 1/12, block $b_{14}$ may be sent using a rate 1/6, block $b_{16}$ may be sent using a rate 1/4, block $b_{19}$ may be sent using a rate 1/3, block $b_{23}$ may be sent using a rate 1/2. Each of the blocks in the protected information section may be protected using one method or another. In some embodiments, they may be protected using a repetition code. In other embodiments, they may be protected using Bose-Chaudhuri-Hocquenghem (BCH) codes. "Protected" or "protection" herein may refer to a bit pattern or coding scheme that provides a certain level of error-correction capabilities.

The number of blocks containing the information bits 505 in the non-perfectly polarized bit channel positions in each polar code 502 may be determined by a total number of factors of m that are greater than one. In the example shown in FIG. 5, m=12, which six factors: 1, 2, 3, 4, 6 and 12, five of which are greater than one, so the total number of blocks $b_n$, which may be represented by L, is 5. Each polar code 502 then contains five (5) blocks of information bits 505 in the non-perfectly polarized bit channel positions.

In more general terms, given m parallel polar codes 502, let $d_i$ represent the value of a factor of m that is greater than one, instead of sending m bit blocks or zero bits through the m bit channels, $$\frac{m}{d_i}$$

blocks of bits 505 is sent through each bit $d_i$ channel in the non-perfectly polarized bit channels in each of the m parallel polar code 502, and each bit in the $$\frac{m}{d_i}$$

blocks of bit may be protected using a repetition code with length $d_i$. A repetition code with length $d_i$ means that the bit (or block of bits) may be repeated a total of $d_i$ times among the m parallel polar codes 502.

In some embodiments, for a given polar code in the m parallel polar codes 502, the code rate $1/d_i$ used to transmit a block of bits in the non-perfectly polarized bit channel positions within the protected information section may be determined by $d_i$. As there are five blocks of bits 505 within the protected information section in each polar code 502 in the example shown in FIG. 5, each of the five blocks may be sent using a different code rate, where the code rate may be determined using a respective, greater-than-one factor of m; here m=12. For example, looking at Polar Code 1, the least reliable bit positions are grouped in a first block (e.g., $b_{13}$) within the non-perfectly polarized bit channel positions, and the code rate for this block is 1/12, where $d_i=12$ is the largest factor of m. As the bit channels increase in reliability in the non-perfectly polarized bit channel positions, the second block (e.g., $b_{14}$) may be sent using a code rate of 1/6, where $d_i=6$ is the second largest factor of m, the third block (e.g., $b_{16}$) may be sent using a code rate of 1/4, where $d_i=4$ is the third largest factor of m, the fourth block (e.g., $b_{19}$) may be sent using a code rate of 1/3, where $d_i=3$ is the fourth largest factor of m, and the fifth block (e.g., $b_{23}$) may be sent using a code rate of 1/2, where $d_i=2$ is the smallest, greater-than-one factor of m.

As mentioned, the code rate "1/$d_i$" also means that the block using the code rate 1/$d_i$ may be repeated $d_i$ times across the m parallel polar codes 502 using a repetition code. Let L represent the total number of blocks containing the information bits 505 in the non-perfectly polarized bit channel positions in each polar code 502. When a repetition code is used, the information bits 505 in a block (e.g., $b_{13}$) of the plurality of L blocks of a first parallel polar code (e.g., Polar Code 1) from the m parallel polar codes are repeated in a block of the plurality of L blocks of a second parallel polar code (e.g., polar code 2) from the m parallel polar codes. How many times a block $b_n$ is repeated may be represented by the code rate 1/$d_i$ used to send the block $b_n$.

In the example shown in FIG. 5, L=5 and m=12. In the column 505a under rate 1/12, the block (e.g., $b_{13}$) is repeated $d_i$=12 times across the 12 parallel polar codes; in the column 505b under rate 1/4, each block (e.g., $b_{16}$, $b_{17}$, or $b_{18}$) is repeated $d_i$=4 times across the 12 parallel polar codes; and in the column 505c under rate 1/2, each block (e.g., one of $b_{23}$ to $b_{28}$) is repeated $d_i$=2 times across the 12 parallel polar codes. Information bits 505 from the Protected Information Section in one parallel polar code may be repeated in more than one other parallel polar codes among the m parallel polar codes 502.

Thus, the information bits 505 in Protected Information Section can be seen as being encoded using both a polar code (i.e., along the horizontal axis) and a repetition code (i.e., along the vertical axis). Additionally, each of the m polar codes 502 includes frozen bits 503 (labeled $f_1$-$f_2$).

It will be understood that FIG. 5 shows only one example, and that other bit placement patterns and/or coding schemes, involving differing numbers of parallel polar codes and differing numbers of blocks of bits may be used in accordance with the disclosed technology. In general, when each bit in the Protected Information Section in one parallel polar code 502 appears in the Protected Information Section of at least one other parallel polar code 502, some benefit is provided with respect to decoding. It will be understood that the illustrated example 500 only shows a simple repetition pattern of the information bits 505, but other repetition pattern may be used.

Let $K_{d_i}$ represent the total number of non-perfectly polarized bit channels in each polar code 502 that are protected using a repetition code with length $d_i$. $K_{d_i}$ can be calculated using an optimization problem method as described below.

With density evolution (DE) the distribution and also probability of error any bit channels (assuming successive-cancelation decoding) can be calculated as follows. Consider the $k_{th}$ bit channel with density $pdf_k$ is protected with a repetition code with length $d_k$. Then the resulting density $pdf_k^n$ can be calculated as:

$$pdf_k^n = \underbrace{pdf_k * pdf_k * \ldots * pdf_k}_{d_i}$$

where "*" indicates the mathematical operation of convolution.

By using the resulting density $pdf_k^n$, the probability of error of protected bit channel can be calculated. The effective rate r of m block of polar codes can be calculated using the following equation:

$$r = \frac{mK_1 + \sum_{i=1}^{L} K_{d_i} \frac{m}{d_i}}{Nm} = \frac{K_1 + \sum_{i=1}^{L} K_{d_i} \frac{1}{d_i}}{N}$$

where $K_1$ is number of bits without additional protection. The optimization problem can be state as:

$$\min_{K_1, K_{d_1}, \ldots, K_{d_L}} FER$$

$$\frac{K_1 + \sum_{i=1}^{L} K_{d_i} \frac{1}{d_i}}{N} = r$$

where $$FER = 1 - \prod_{k=1}^{K_c+K_1} (1 - Pe(i_k)),$$

Kc is the total number of bits in the non-perfectly polarized bit channels, and $Pe(i_k)$ is a probability of error of $i_k^{th}$ bit channel and can be predetermined.

Assuming the bit channels are ordered based on its reliability and more protection may be implemented for more unreliable bits, the FER can be written as:

$$FER = 1 - \prod_{k \in A_{d_L}} (1 - Pr(k, d_L)) \prod_{k \in A_{d_{L-1}}} (1 - Pr(k, d_{L-1})) \ldots \prod_{k \in A_{d_1}} (1 - Pr(k, d_1))$$

where $A_i = \{N-K_1-\ldots-K_i+1:N-K_1-\ldots-K_i\}$, and $Pr(k, d_i)$ is the probability of error for $k^{th}$ bit channel when protected a repetition code with length $d_i$.

By using Density Evaluation, an efficient method is provided herein to optimize the number of non-perfectly polarized bit channels that need more protection and also a degree of protection for the bit channels.

Figure 6:
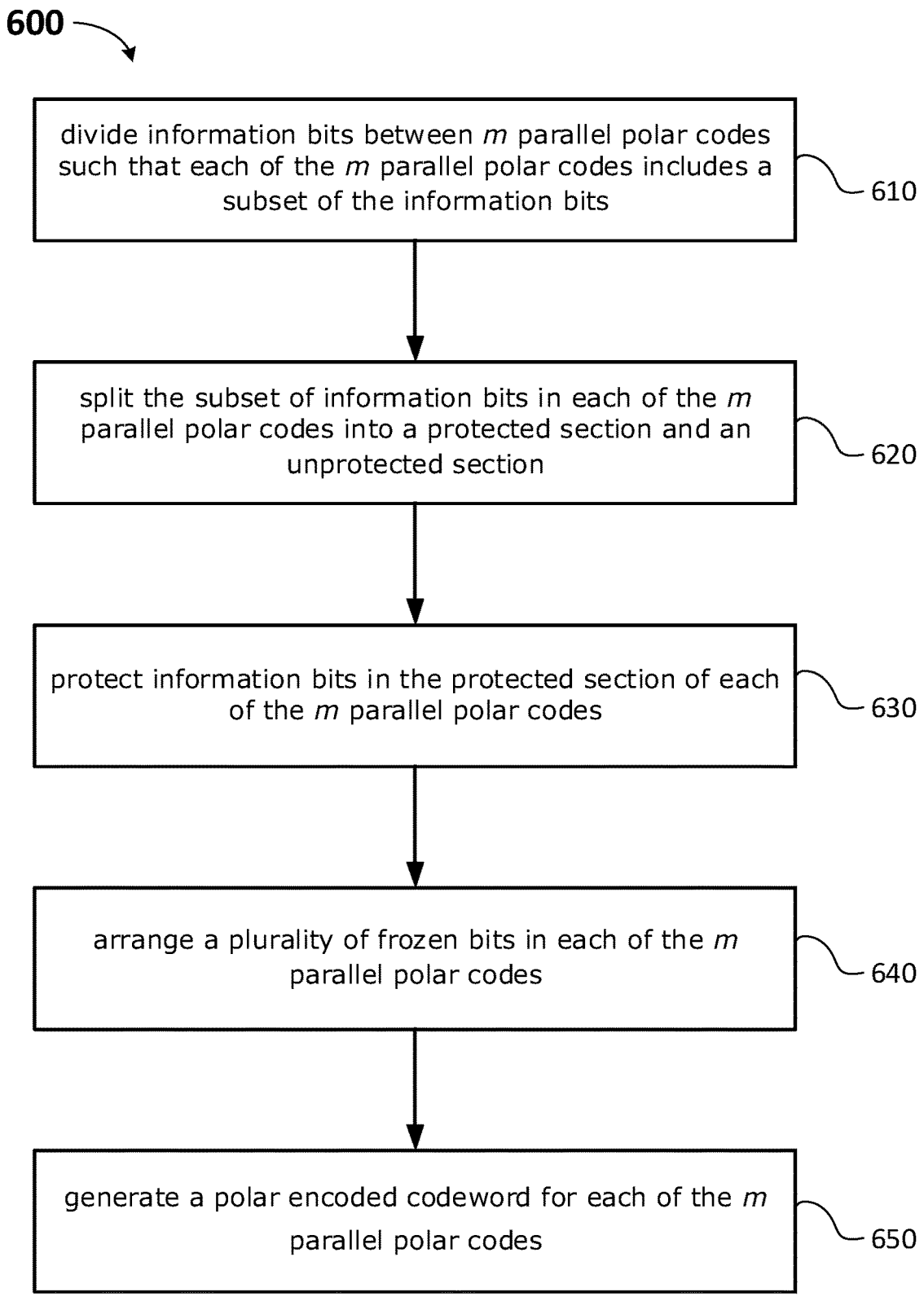
FIG. 6 shows a flowchart of an encoding method in accordance with some example embodiments.

FIG. 6 shows a flowchart of an encoding method 600 in accordance with an implementation of the disclosed technology. The encoder accepts p information bits and uses m parallel polar codes to encode the information. In step 610, the encoder distributes the p bits of information to be encoded into m portions or subsets, each of which will be encoded in one of the m parallel polar codes. Some bits of information in one portion or subset from the m portions or subsets may be repeated in another portion or subset from the m portions or subsets. In general, p and m may be selected so that this division results in an equal whole number of bits of information to be encoded in each of the parallel polar codes. Alternatively, the p information bits may be padded to achieve such a division of the bits.

In step 620, the p/m information bits for each polar code are split (separated or treated separately) into a protected information section and a full rate information section. This split is performed such that information bits in the protected information section may be transmitted using non-perfectly polarized bit channels, while the information bits in the full rate information section may be transmitted using more perfectly polarized bit channels (e.g., having a bit channel capacity in the range of 0.9 to 1).

In some embodiments, for each of the m parallel polar codes: the positions in the non-perfectly polarized bit channels are grouped into a plurality of L blocks, wherein each of the plurality of L blocks includes a subset of the information bits in the protected information section.

In some embodiments, a total number of the plurality of blocks in the non-perfectly polarized bit channels in each of the m parallel polar codes is determined based on a total number of greater-than-one factors of m.

In step 630, the information bits in the protected information section of each of the m parallel polar codes are protected. To achieve this, in some implementations a repetition code such as was discussed above with reference to FIG. 5 may be used, though other protection schemes are also possible.

In some embodiments, the information bits in a block of the plurality of L blocks of a first parallel polar code from the m parallel polar codes are repeated in a block of the plurality of L blocks of a second parallel polar code from the m parallel polar codes.

In some embodiments, the information bits in a block of the plurality of L blocks of a first parallel polar code from the m parallel polar codes are repeated $d_i$ times in the m parallel polar codes, $d_i$ being a factor of m and greater than one.

In some embodiments, the information bits in the protected information section of each of the m parallel polar codes are protected using a Bose-Chaudhuri-Hocquenghem (BCH) code or a Reed-Muller code.

In some embodiments, the information bits in a block of the plurality of L blocks of a first parallel polar code from the m parallel polar codes may be protected using two or more protection schemes, such as a repetition code, a BCH code, and/or a Reed-Muller code.

In some embodiments, a parallel polar code in the m parallel polar codes may be protected using a first protection scheme (e.g., a repetition code), while another parallel polar code in the m parallel polar codes may be protected using a second protection scheme (e.g., a BCH or Reed-Muller code).

In step 640, frozen bits are arranged into each of the m parallel polar codes. "Arranging" here means to place or position the bits in the parallel polar codes. For example, one or more frozen bits can be added to each of the m parallel polar codes, where each frozen bit occupies a perfectly polarized bit channel that has a bit capacity approaching 0. Although the frozen bits 503 are shown, for ease of illustration in FIG. 5, as being located at the front within each m polar code, before the information bits 505 and 506, they may, in fact, be scattered throughout the information bits 505 and 506 in each polar code. Generally, these frozen bits may all have the same constant value of "0" or "1", and this value will be known by both the encoder and the decoder. It will be understood that in some implementations, other patterns of frozen bits may be used, provided that the value of each frozen bit is known by both the encoder and decoder. With the frozen bits, each of the parallel codes should have a predetermined size that is a power of 2 (i.e., the size of the code $N=2^n$, where n is an integer).

In step 650, a conventional polar encoding method is applied to each of the parallel polar codes to generate an encoded codeword for each of the parallel polar codes. These codewords may then be transmitted over a channel, such as a wireless channel, a cable, or an optical fiber. The polar encoding method may be an encoding method such as is described above with reference to FIG. 1, an encoding such as in described in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009), or any other known method or algorithm for polar encoding.

Using an encoder as described with reference to FIG. 6 provides for the encoding of $m \times (l_{protected} + l_{unprotected})$ information bits, where $l_{protected}$ is the number of bits in the protected information section of each parallel polar code, $l_{unprotected}$ is the number of bits in the full rate information section of each parallel polar code, and m is the number of parallel polar codes, in a total of $m \times (l_{protected} + l_{unprotected} + l_{frozen})$ encoded bits, where $l_{frozen}$ is the number of frozen bits in each parallel polar code.

Figure 7:
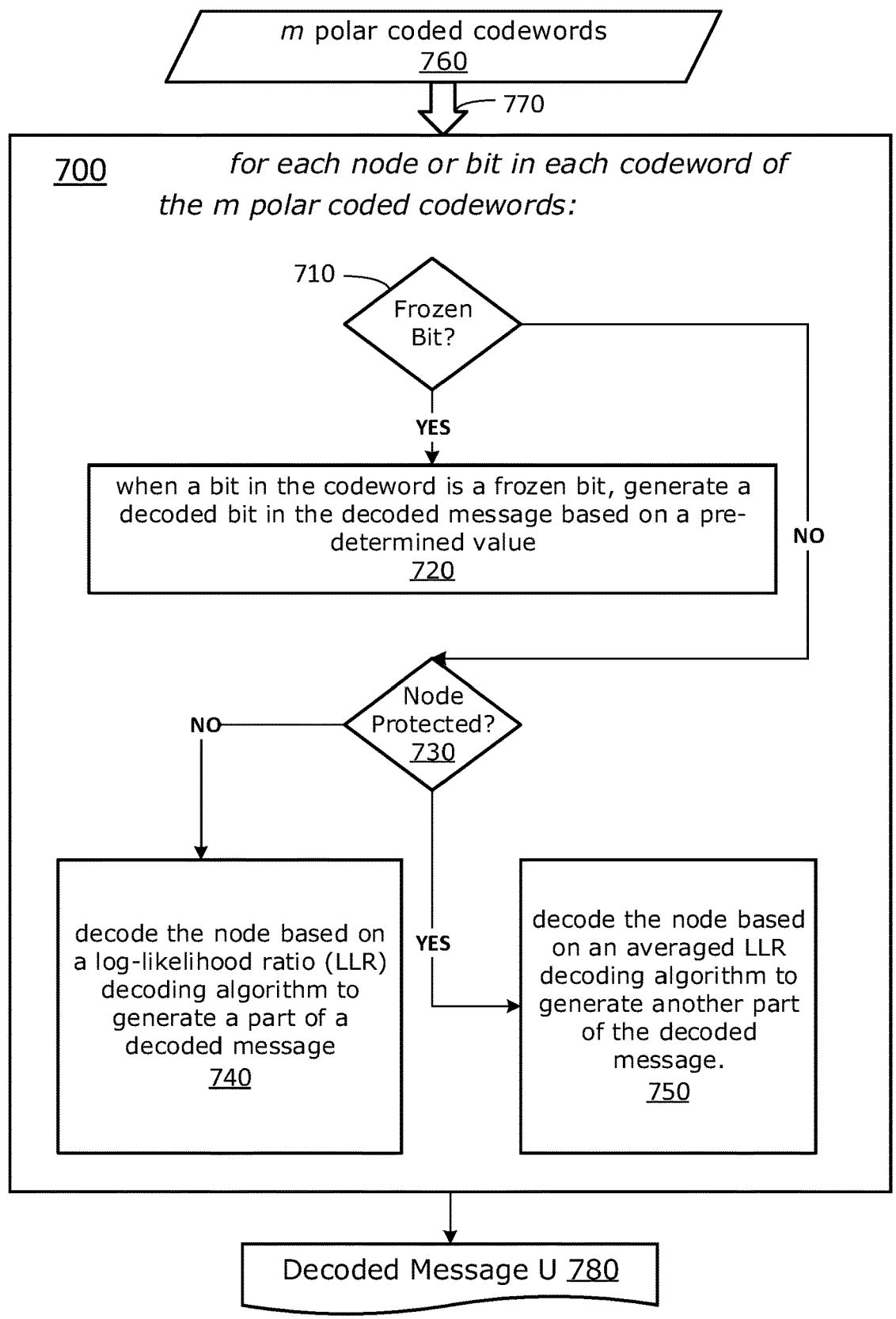
FIG. 7 shows a flowchart of a decoding method in accordance some example embodiments.

FIG. 7 shows a flowchart of a decoding method 700 in accordance with various implementations of the disclosed technology. As is generally the case, the decoding is performed on codewords received over a noisy channel, with the goal of correctly decoding from the received codewords, the information that was originally encoded and sent over the channel. Thus, in step 770, the decoder receives m parallel polar codewords 760 to be decoded. The codewords 760 are received over a channel, such as a wireless channel, a cable, or an optical fiber. There may have been noise or interference on the channel, meaning that some of the bits of the received codewords 760 may have been altered during transmission, and may not be the same as the bits in the codewords that were transmitted over the channel. Accordingly, the decoder should be able to detect and (for FEC) correct these errors.

In accordance with an implementation of the disclosed technology, the decoding method is designed with a low complex and uses low power decoding using a successive-cancellation (SC) or successive-cancellation-list (SCL) decoder. The method 700 is implemented to use parallel and independent decoding of several code words until the leaf is reached.

The method 700 is performed by a SC or SCL decoder for each codeword in the m polar coded codewords 760, which includes a plurality of encoded bits. The encoded bit may be a frozen bit or part of a message encoded based on a portion or subset of the p information bits as described above in reference to FIG. 6. In a conventional SC decoding method, for polar codes with length of $N=2^n$, the decoding method can be expressed as a full binary tree $T_n$ of depth n. At step 710, a node in the binary tree $T_n$, which may be a bit, is examined to see if it is part of a set of leaf nodes that are all frozen bits ("frozen nodes"). When the node belongs to the set of frozen nodes, at step 720, which means the encoded bit in the respective codeword is a frozen bit, a decoded bit is generated in the decoded message 780 based on a predetermined value, which may be, for example, 1 or 0.

When the node does not belong to any set of frozen leaf nodes, at step 730, the decoder checks to see if the node is in the protected information section. When the node is in the full rate information section at step 740: the decoder, which can be a successive-cancellation (SC) or successive-cancellation-list (SCL) decoder, can decode the node using a log-likelihood ratio (LLR) decoding algorithm to generate a first part of a decoded message 780. A SC decoder is described, for example, in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009). A SCL decoder is described, for example, in Tal and A. Vardy, "List decoding of polar codes", *IEEE Trans. IT*, vol. 61, no. 5, pp. 2213-2226, March 2015.

When the node is in the protected information section at step 750: the decoder, which can be a successive-cancellation (SC) or successive-cancellation-list (SCL) decoder, may decode the node using an averaged LLR decoding algorithm to generate another part of the decoded message 780. In some embodiments, at step 750, a node with a repetition code with length $d_i$ for a $$\frac{m}{d_i}$$

number of information blocks may be decoded using the following averaged LLRs:

$$LLR_k^n = \frac{1}{K} \sum_{j=(k-1)*d_i+1}^{k*d_i} LLR_j^o$$

where $$\leq k \leq \frac{m}{d_i},$$

$d_i$ is a total number of repetitions for the node in the m polar coded codewords, n denotes that $LLR_k^n$ are new modified LLRs, and $LLR_j^o$ is the original LLR of the node in the respective codeword i in the m polar coded codewords, j=1 . . . m, K represents the number of LLRs that are involved in averaging, and "*" here indicates the mathematical operation of multiplication.

In some embodiments, at step 750, a node with a repetition code with length $d_i$ for a $$\frac{m}{d_i}$$

number of information blocks may be decoded using a different decoding algorithm, such as for example, the BCH code or the Reed-Muller code.

The decoding method 700 may perform a parallel decoding of all of the m parallel polar codewords are decoded.

Figure 8:
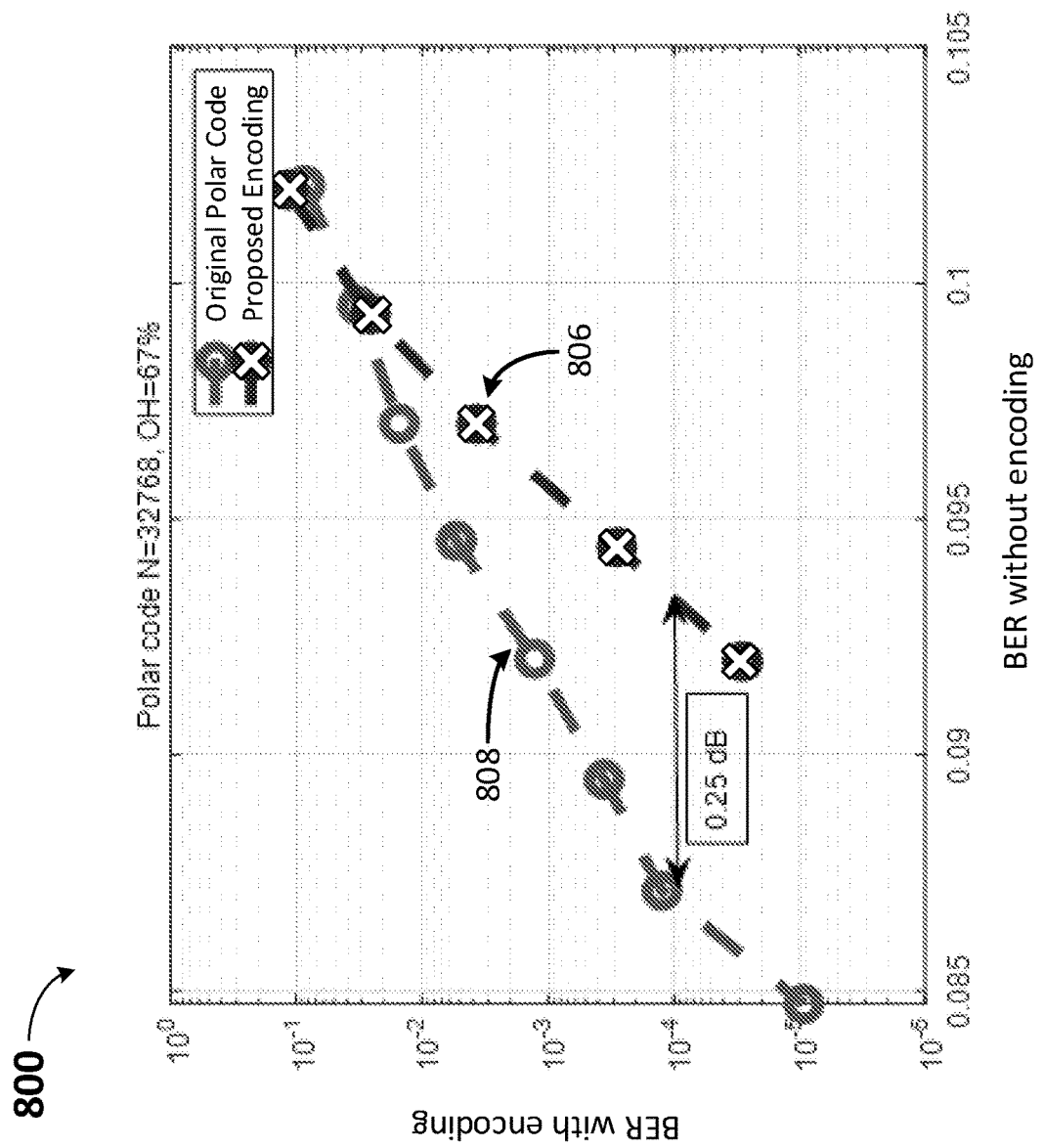
FIG. 8 is shows simulation results results of a parallel polar coding method in accordance with an implementation of the disclosed technology.

FIG. 8 shows a graph 800 of simulation results of a parallel polar coding method in accordance with an implementation of the disclosed technology as described above ("proposed method" curve 806), compared to an original polar code ("original polar code" curve 808), such as ones introduced in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009). For the simulation, the polar code length N was 32768 bits, with an overhead of 67%. The horizontal axis shows a bit error rate (BER) without any encoding. The vertical axis shows a bit error rate with some form of encoding.

As can be seen, the proposed method curve 806 shows an approximately 0.25 dB improvement over the original polar code curve 808. As will be understood by one skilled in the art, this represents a significant improvement in the performance of a forward error correction code.

It will be understood that, although the embodiments presented herein have been described with reference to specific features and structures, various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

The invention claimed is:

1. A method for encoding information bits for transmission across a communication channel, the method comprising:

distributing information bits between m parallel polar codes such that each of the m parallel polar codes includes a subset of the information bits, wherein m is the number of parallel polar codes;

splitting the subset of information bits in each of the m parallel polar codes into a protected information section and a full rate information section, information bits in the protected information section of each of the m parallel polar codes being arranged in positions in a plurality of first bit channels in the respective parallel polar code of the m parallel polar codes and grouped into a plurality of L blocks, wherein each of the plurality of L blocks comprises a subset of the information bits in the protected information section for each of the m parallel polar codes, wherein L is the number of blocks;

protecting the information bits in the protected information section of each of the m parallel polar codes;

arranging a plurality of frozen bits in each of the m parallel polar codes, with the plurality of frozen bits being arranged in positions in a plurality of second bit channels that have a capacity near zero; and generating a polar encoded codeword for each of the m parallel polar codes.

2. The method of claim 1, wherein the plurality of first bit channels are bit channels that have a capacity between 0 and 1.

3. The method of claim 1, wherein the plurality of first bit channels are non-perfectly polarized bit channels.

4. The method of claim 1, wherein the information bits in the protected information section of each of the m parallel polar codes are protected using a repetition code.

5. The method of claim 4, wherein the information bits in a block of the plurality of L blocks of a first parallel polar code from the m parallel polar codes are repeated in a block of the plurality of L blocks of a second parallel polar code from the m parallel polar codes.

6. The method of claim 5, wherein the information bits in a block of the plurality of L blocks of a first parallel polar code from the m parallel polar codes are repeated $d_i$ times in the m parallel polar codes, $d_i$ being a factor of m and greater than one.

7. The method of claim 1, wherein a total number of the plurality of blocks in the non-perfectly polarized bit channels in each of the m parallel polar codes is determined based on a total number of greater-than-one factors of m.

8. A decoding method, comprising:

receiving m polar coded codewords over a communication channel, each of the m polar coded codewords encoding a subset of information bits in a plurality of nodes and a frozen bit, wherein the information bits are distributed between the m polar coded codewords and m is the number of polar coded codewords; and for each of the m polar coded codewords, decoding the polar coded codewords to generate a decoded message comprising a decoded bit for the frozen bit, a first part for a node in a full rate information section of the polar coded codeword and a second part for a node in a protected information section of the polar coded codeword, wherein the decoded bit is generated based on a predetermined value, the first part is generated based on a log-likelihood ratio (LLR) decoding algorithm and the second part is generated based on an averaged LLR decoding algorithm.

9. The method of claim 8, wherein the decoding of the node is performed by a successive-cancellation (SC) or a successive-cancellation-list (SCL).

10. The method of claim 8, wherein the averaged LLR decoding algorithm is based on:

$$LLR_k^n = \frac{1}{K} \sum_{j=(k-1)*d_i+1}^{k*d_i} LLR_j^o$$

where $$\le k \le \frac{m}{d_i},$$

$d_i$ is a total number of repetitions for the node in the m polar coded codewords, n represents that $LLR_k^n$ are new modified LLRs, and $LLR_j^o$ is the original LLR of the node in the respective codeword j in the m polar coded codewords, j=1 . . . m, K represents that the number of LLRs that are involved in averaging, and "*" here indicates the mathematical operation of multiplication.

11. An encoder that encodes information bits for transmission across a communication channel, the encoder comprising at least one processor and a memory storing programmed instructions that, when executed by the at least one processor, cause the encoder to perform the following steps:
distributing the information bits between m parallel polar codes such that each of the m parallel polar codes includes a subset of the information bits, wherein m is the number of parallel polar codes;
splitting the subset of information bits in each of the m parallel polar codes into a protected information section and a full rate information section, information bits in the protected information section of each of the m parallel polar codes being arranged in positions in a plurality of first bit channels in the respective parallel polar code of the m parallel polar codes and grouped into a plurality of L blocks, wherein each of the plurality of L blocks comprises a subset of the information bits in the protected information section, wherein L is the number of blocks;
protecting the information bits in the protected information section of each of the m parallel polar codes;
arranging a plurality of frozen bits in each of the m parallel polar codes, with the plurality of frozen bits being arranged in positions in a plurality of second bit channels that have a capacity near zero; and
generating a polar encoded codeword for each of the m parallel polar codes.

12. The encoder of claim 11, wherein the plurality of first bit channels are bit channels that have a capacity between 0 and 1.

13. The encoder of claim 11, wherein the plurality of first bit channels are non-perfectly polarized bit channels.

14. The encoder of claim 11, wherein the information bits in the protected information section of each of the m parallel polar codes are protected using a repetition code.

15. The encoder of claim 11, wherein the information bits in a block of the plurality of L blocks of a first parallel polar code from the m parallel polar codes are repeated in a block of the plurality of L blocks of a second parallel polar code from the m parallel polar codes.

16. The encoder of claim 15, wherein the information bits in a block of the plurality of L blocks of a first parallel polar code from the m parallel polar codes are repeated $d_i$ times in the m parallel polar codes, $d_i$ being a factor of m and greater than one.

17. A decoder comprising:
at least one processor and a memory storing programmed instructions that, when executed by the at least one processor, cause the decoder to perform the following steps:
receiving m polar coded codewords over a communication channel, each of the m polar coded codewords encoding a subset of information bits in a plurality of nodes and a frozen bit, wherein the information bits are distributed between the m polar coded codewords and m is the number of polar coded codewords; and
for each of the m polar coded codewords, decoding the polar coded codeword to generate a decoded message comprising a decoded bit for the frozen bit, a first part for a node in a full rate information section of the polar coded codeword and a second part for a node in a full rate information section of the polar coded codeword, wherein the decoded bit is generated based on a predetermined value, the first part is generated based on a log-likelihood ratio (LLR) decoding algorithm and the second part is generated based on an averaged LLR decoding algorithm.

18. The decoder of claim 17, wherein the averaged LLR decoding algorithm is based on:

$$LLR_k^n = \frac{1}{K} \sum_{j=(k-1)*d_i+1}^{k*d_i} LLR_j^o$$

where $$\le k \le \frac{m}{d_i},$$

$d_i$ is a total number of repetitions for the node in the m polar coded codewords, n represents that $LLR_k^n$ are new modified LLRs, and $LLR_j^o$ β is the original LLR of the node in the respective codeword j in the m polar coded codewords, j=1 . . . m, K represents that the number of LLRs that are involved in averaging, and "*" here indicates the mathematical operation of multiplication.

* * * * *

UNITED STATES PATENT AND TRADEMARK OFFICE
CERTIFICATE OF CORRECTION

PATENT NO. : 12,015,480 B2
APPLICATION NO. : 18/070035
DATED : June 18, 2024
INVENTOR(S) : Hamid Ebrahimzad and Zhuhong Zhang It is certified that error appears in the above-identified patent and that said Letters Patent is hereby corrected as shown below:

In the Specification

In Column 14, Lines 10-14:

The words "subject to:" should appear before the equation $$\frac{K_1 + \sum_{i=1}^{L} K_{d_i} \frac{1}{d_i}}{N} = r$$

Signed and Sealed this
Nineteenth Day of November, 2024

Katherine Kelly Vidal
*Director of the United States Patent and Trademark Office*